(12) United States Patent
Zimlich

(10) Patent No.: US 7,349,273 B2
(45) Date of Patent: Mar. 25, 2008

(54) ACCESS CIRCUIT AND METHOD FOR ALLOWING EXTERNAL TEST VOLTAGE TO BE APPLIED TO ISOLATED WELLS

(75) Inventor: David A. Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/588,989

(22) Filed: Oct. 27, 2006

(65) Prior Publication Data

US 2007/0041232 A1    Feb. 22, 2007

Related U.S. Application Data

(62) Division of application No. 11/439,635, filed on May 23, 2006, which is a division of application No. 11/259,841, filed on Oct. 26, 2005, now Pat. No. 7,116,570, which is a division of application No. 10/748,732, filed on Dec. 29, 2003, now Pat. No. 7,027,316.

(51) Int. Cl.
*G11C 7/00* (2006.01)
*G11C 5/06* (2006.01)
*G11C 11/36* (2006.01)
*H01L 29/00* (2006.01)

(52) U.S. Cl. .................. 365/201; 365/72; 365/175; 365/177; 365/191; 365/202; 257/499

(58) Field of Classification Search .................. 365/72, 365/201, 175, 177, 191, 202; 257/499, 544
See application file for complete search history.

(56) References Cited

U.S. PATENT DOCUMENTS

| | | | | |
|---|---|---|---|---|
| 4,395,723 A | | 7/1983 | Harari | 257/260 |
| 5,303,193 A | * | 4/1994 | Ogihara | 365/201 |
| 5,541,875 A | * | 7/1996 | Liu et al. | 365/177 |
| 5,933,378 A | * | 8/1999 | Gans et al. | 365/201 |
| 5,990,521 A | * | 11/1999 | Horiuchi | 257/369 |
| 6,055,655 A | * | 4/2000 | Momohara | 714/723 |
| 6,262,625 B1 | | 7/2001 | Perner et al. | 330/2 |
| 6,278,287 B1 | | 8/2001 | Baze | 326/9 |
| 6,377,511 B1 | * | 4/2002 | Okuda et al. | 365/233 |
| 6,535,435 B2 | | 3/2003 | Tanaka et al. | 365/189.09 |
| 6,807,109 B2 | * | 10/2004 | Tomishima | 365/189.05 |
| 6,888,769 B2 | | 5/2005 | Kirsch | 365/205 |
| 6,906,551 B2 | * | 6/2005 | Mizuno et al. | 326/81 |
| 2003/0112659 A1 | | 6/2003 | Ohsawa | 365/174 |

OTHER PUBLICATIONS

Favrat, Pierre et al., "A High-Efficiency CMOS Voltage Doubler", IEEE Journal of Solid-State Circuits, vol. 33, No. 3, Mar. 1998, pp. 410-416.

\* cited by examiner

*Primary Examiner*—Ly Duy Pham
(74) *Attorney, Agent, or Firm*—Dorsey & Whitney LLP

(57) ABSTRACT

An access circuit selectively couples an externally accessible terminal to each of a plurality of isolated DRAM wells in which respective DRAM arrays are fabricated. The access circuit for each well includes first and second transistors fabricated in respective wells coupled between the externally accessible terminal and a respective one of the DRAM wells. The well of the first transistor is coupled to the externally accessible terminal, and the well of the other transistor is coupled to a respective DRAM well. A control circuit applies select signals to gate electrodes of the first and second transistors. The control circuit includes respective shunt transistors that shunt the gate electrodes to the source regions of the first and second transistors when the transistors are turned off to isolate the respective DRAM wells from the external terminal regardless of the magnitude and polarity of a test voltage applied to the externally accessible terminal.

7 Claims, 7 Drawing Sheets

US 7,349,273 B2

1

ACCESS CIRCUIT AND METHOD FOR ALLOWING EXTERNAL TEST VOLTAGE TO BE APPLIED TO ISOLATED WELLS

CROSS-REFERENCE TO RELATED APPLICATIONS

This application is a divisional of pending U.S. patent application Ser. No. 11/439,635 filed May 23, 2006 which is a divisional of U.S. patent application Ser. No. 11/259,841, filed Oct. 26, 2005, now U.S. Pat. No. 7,116,570, which is a divisional of U.S. patent application Ser. No. 10/748,732, filed Dec. 29, 2003, U.S. Pat. No. 7,027,316 issued on Apr. 11, 2006.

TECHNICAL FIELD

This invention relates to integrated circuits such as memory devices, and, more particularly, to a circuit and method for allowing an externally applied test voltage to be applied to each of several isolated wells in which semiconductor devices are fabricated.

BACKGROUND OF THE INVENTION

With reference to FIG. 1, a semiconductor structure 10 includes a substrate 12 having formed therein a well 14, which is a region of the substrate 12 that is doped oppositely to the doping of the substrate 12. For example, the substrate 12 of FIG. 1 is a p-type substrate. A deep n-type well 16 is implanted into the substrate 12 to form a buried layer. A surface n-well in areas 18, 20 surrounds the buried layer n-type well 16 to form a doughnut shape where the center is a p-type well 14 that is now completely isolated from the substrate 12, thus allowing a separate bias voltage. Various semiconductor devices can be fabricated into the well 14, such as an n-channel transistor 22. In practice, a large number of semiconductor devices can be fabricated into the well 14 to form an integrated circuit.

The junction between the well 14 and the deep n-well 16 forms a p-n junction or diode 24 that is schematically illustrated in phantom in FIG. 1. A similar diode 26 is formed by a p-n junction between the deep n-well 16 and the p-type substrate 12. The diodes 24, 26 are inherently formed with a back-to-back connection, thereby isolating the p-well 14 from the substrate 12, and, therefore, from other devices that are also fabricated into the substrate 12. The p-well 14 is often biased to a negative bias voltage, which is often provided by a negative voltage charge pump, commonly known as a $V_{bb}$ charge pump. By fabricating the memory cell arrays in respective wells, each of several array wells can be isolated from each other and from other circuitry fabricated in the substrate 12. Similar diodes (not shown) are formed by the p-n junctions between the n-wells 18, 20 and both the p-well 14 and the substrate 12. However, the diodes are inherently coupled to each other back-to-back to isolate the p-well from the substrate 12. In practice, the n-wells 18, 20 are typically biased to a relatively large positive voltage, such as a supply voltage $V_{cc}$ or a positive pumped voltage $V_{ccp}$, to maintain the diodes reverse or back-bias.

As explained above, fabricating integrated circuits into the wells also allows the wells 14 to be biased to a voltage that enhances the performance of integrated circuits fabricated in the wells 14. For example, it is common to bias the wells 14 in which DRAM arrays have been fabricated to a negative voltage, which reduces the leakage of access transistors (not shown) coupled to respective DRAM memory cells. As is well known in the art, reducing access transistor leakage allows the memory cells to store data for a longer period to reduce refresh rates. However, it is desirable to perform post-fabrication testing of the integrated circuit under "worst case" conditions for the purpose of detecting failures that are likely to occur after the integrated circuit is placed in service. Again using the example of DRAM arrays, it is desirable to test the data retention time of a DRAM array fabricated in the well 14 with the well 14 biased to ground voltage. If the data retention time is achieved with the well 14 biased to ground or a less negative voltage, then it will inherently do so when the well 14 is biased to a more negative voltage during operation. The test voltage can be applied to the well 14 from an externally accessible terminal 30. To allow the terminal 30 to be used for other purposes during use of an integrated circuit fabricated in the substrate 12, the terminal 30 is preferably coupled to the well 14 through a transistor 34 fabricated into the substrate 12.

FIG. 2 shows a semiconductor structure 40 in which a p-type well or core 42 is fabricated in a substrate 44, and a DRAM array is 46 fabricated in the p-type core 42. Like the p-well 14 of FIG. 1, the core 42 is isolated from the substrate 12 by n-wells 18, 20 (not shown in FIG. 2) and the deep n-well 16. The core 42 is coupled through a p+ region 47 to an externally accessible terminal 48 through an n-channel transistor 50. The transistor 50 is fabricated in a p-type well 52 in which first and second n-type source-drain regions 56, 58 are fabricated. The p-well 52 is also isolated from the substrate 12 by n-wells 18, 20 and the deep n-well 16. A gate electrode 60 is fabricated between the source-drain regions 56, 58 and is insulated from the well 42 by a gate insulating layer 62 to form an MOS device. The externally accessible terminal 48 is connected to the first source-drain region 56 The second source-drain region 58 is connected to the well 52 through a p+ region 54 that is more positively doped than the doping of the p-well 52 and to the core 42 in which the array 46 is fabricated through a similar p+ region 55. As is well-known in the art, coupling the terminal 48 to the well 52 and to the core 42 through p+ regions 54, 55, respectively, reduces the resistance of the contact with the well 52 and to the core 42. As explained above with reference to FIG. 1, the junction between each p-type region and each n-type region forms a diode, one of which 68 is shown in phantom in FIG. 2. The significance of this diode 68 will be explained. with reference to FIG. 3. There is also a diode created by the junction between the n-type source-drain region 58 and the p-type well 52, but since this diode would be shorted out by the direct connection between the region 58 and well 52, it is not shown in FIG. 2.

In operation, the transistor 50 isolates the externally accessible terminal 48 from the core 42 during normal use of an integrated circuit, such as a DRAM device, fabricated in the substrate 44. During this time, the core 42 can be biased to a negative voltage while the substrate 44 remains at ground potential. When the array 46 is to be tested under "worst-case" conditions, a positive voltage is applied to the gate electrode 60 by suitable means to form a conductive n-type channel between the source-drain regions 56, 58. The transistor 50 then couples the externally accessible terminal 48 to the core 42 so that a positive test voltage can be applied to the core 42 through the terminal 48. A negative test voltage can also be applied to the core 42 through the terminal 48 when the transistor 50 is turned ON. However, if the negative test voltage is more than about 0.6 v less than the voltage to which the core 42 is biased by a $V_{bb}$ charge pump (not shown in FIG. 2), the diode 68 will be forward biased. As a result, the core 42 will be coupled to the externally accessible terminal 48 regardless of the conductive state of the transistor 50.

The problem caused by the diode 68 becoming forward-biased by a negative test voltage will now be explained with reference to FIG. 3. FIG. 3 shows a portion of a DRAM device 70 having two DRAM cores 72, 74 coupled to respective $V_{bb}$ charge pumps 76, 78. The cores 72, 74 are also coupled to an externally accessible terminal 80 by respective transistors 82, 84, each of which is controlled by a respective select signal, Sel. A and Sel. B, respectively. The diodes 68 coupled between the source-drain regions 56, 58 (FIG. 2) of the transistors 82, 84 are also shown in FIG. 3. Although the DRAM device 70 is shown in FIG. 3 as having two DRAM cores 72, 74, it will be understood that other DRAM devices can have a large number of DRAM cores.

During testing of the DRAM device 70, it is desirable to individually test the operation of each of the cores 72, 74 without affecting the operation of the core not being tested. For example, it is desirable to be able to apply a negative or positive test voltage to the terminal 80, and then individually turn ON each of the transistors 82, 84 to couple the test voltages to the respective cores 72, 74. However, when a test voltage is applied to the terminal 80 that is significantly more negative than the bias voltages being supplied to the cores 72, 74 by the $V_{bb}$ charge pumps 76, 78, the OFF transistor 82, 84 will effectively be rendered conductive by the diode 68 becoming forward-biased. For example, when the Sel. B signal is driven high to turn ON the transistor 84, a large negative test voltage can be applied to the core 74 from the terminal 80. However, this test voltage will also be applied to the core 72 through the diode 68 formed in parallel with the transistor 82. For this reason, it is not possible to adequately test the cores of an integrated circuit using the circuitry shown in FIG. 2, since a large negative voltage cannot be applied to the individual cores. There is therefore a need for a circuit and method that would allow integrated circuit cores to be individually tested with relatively large negative and positive test voltages.

SUMMARY OF THE INVENTION

An access circuit and method is used to apply a test voltage from an externally accessible terminal to each of a plurality of isolated circuit wells fabricated in a semiconductor substrate. The access circuit and method includes a first transistor fabricated in a first well formed in the semiconductor substrate that is isolated from the circuit wells. The first transistor has a first source-drain region fabricated in the first well that is coupled to the externally accessible terminal and to the first well. The first transistor also includes a second source-drain region fabricated in the first well, and a gate electrode fabricated between the first and second source-drain regions. The access circuit also includes a second transistor that may be fabricated in a second well formed in the semiconductor substrate that is isolated from the circuit wells and the first well. The second transistor has a first source-drain region fabricated in the second well that is coupled to the second source-drain region of the first transistor. A second source-drain region fabricated in the second well is coupled to the second well and to a respective one of the circuit wells. The second transistor also includes a gate electrode fabricated between the first and second source-drain regions in the second well.

The access circuit and method may include a control circuit for applying select signals to the gate electrodes of each of the first and second transistors. The control circuit preferably includes for each of the first and second transistors a shunt transistor and a control transistor. The shunt transistor is coupled between the externally accessible terminal and the gate electrode of the first transistor. The control transistor is coupled between the externally accessible terminal and a gate of the shunt transistor, and it has a gate coupled to receive an access signal.

DETAILED DESCRIPTION OF THE INVENTION

Figure 1:
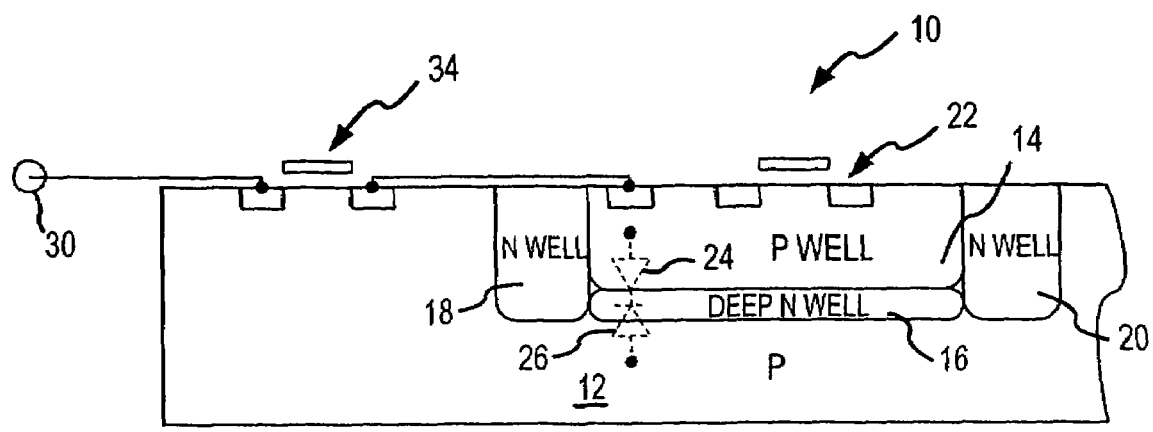
FIG. 1 is a cross-sectional view of a semiconductor structure showing an isolated well fabricated in a substrate and coupled to an externally accessible terminal in a conventional manner.
Figure 3:
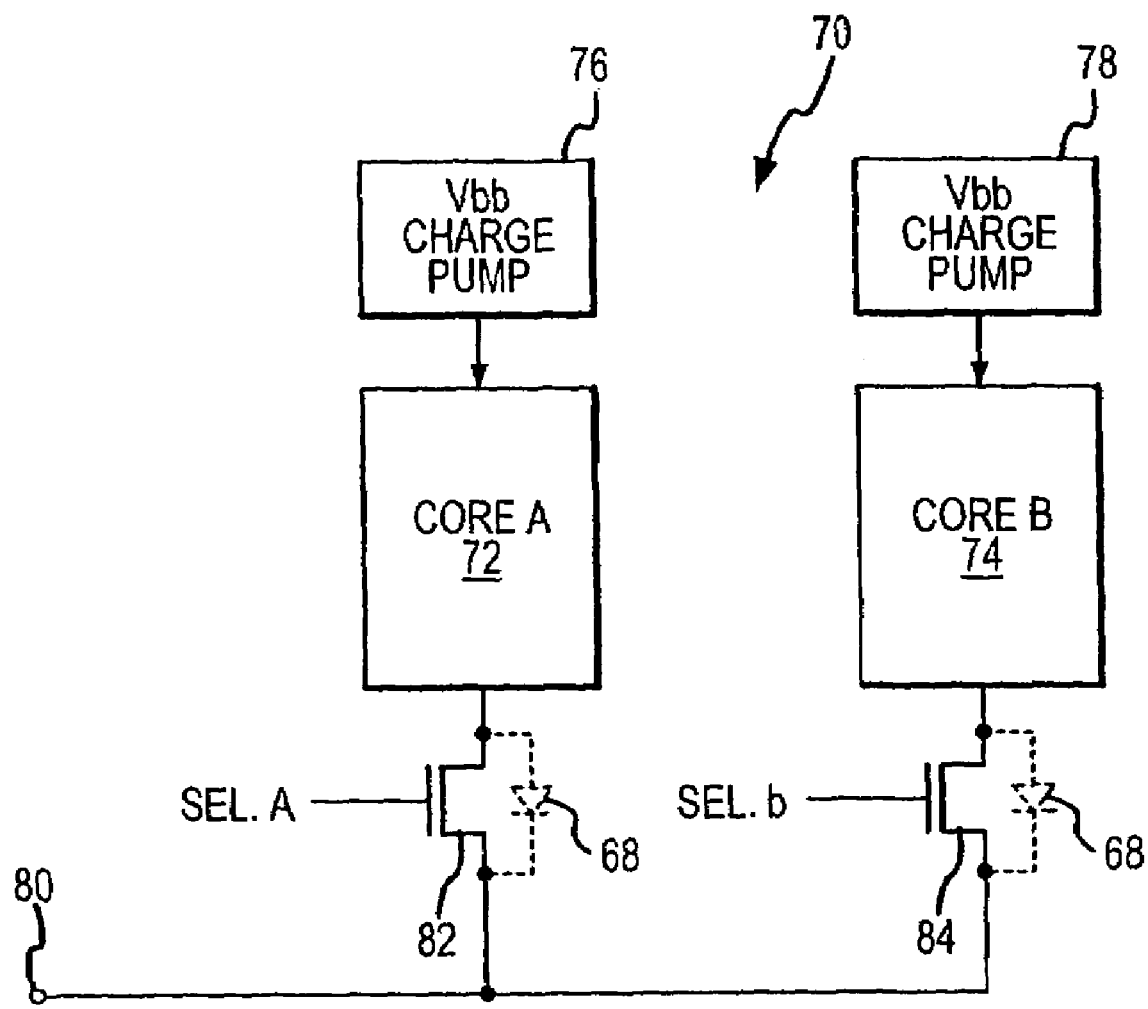
FIG. 3 is a schematic and block diagram of a conventional circuit for coupling an externally accessible terminal to either of two DRAM cores using the semiconductor structure of FIG. 2.
Figure 4:
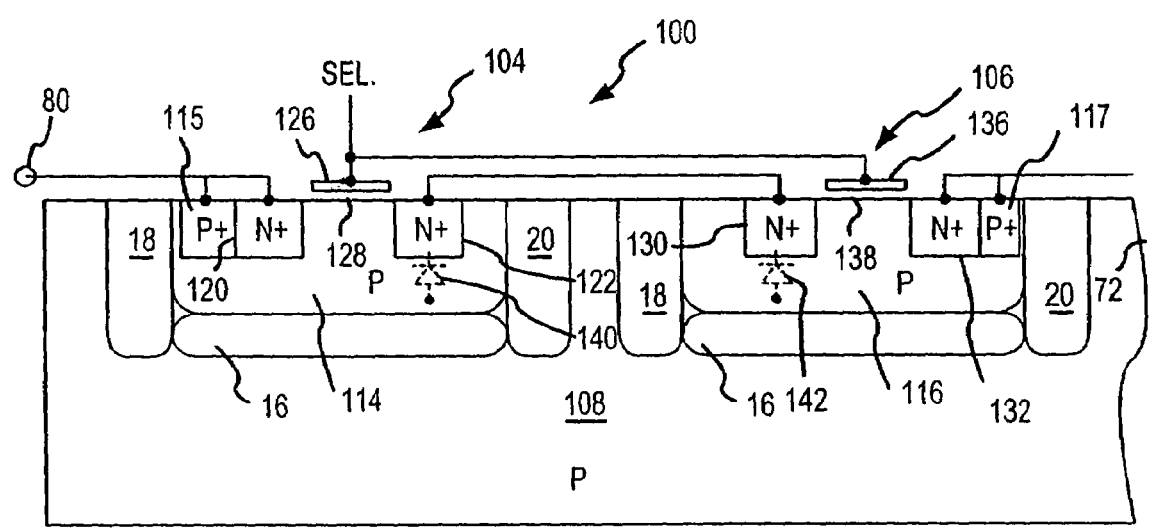
FIG. 4 is a cross-sectional view of a semiconductor structure that can be used to couple an externally accessible terminal to either of the two DRAM cores according to one embodiment of the invention.

FIG. 4 shows a semiconductor structure 100 that can be used in place of each of the transistors 82, 84 used in the DRAM device 70 shown in FIG. 3. The semiconductor structure 100 includes a first transistor 104 coupled in series with a second transistor 106. The transistors 104, 106 are coupled between the externally accessible terminal 80 (FIG. 3). and respective one of the DRAM cores 72, 74. The transistors 104, 106 are fabricated in respective wells 114, 116 that are, in turn, fabricated in a substrate 108. Like the p-well 14 of FIG. 1, the wells 114, 116 are isolated from the substrate 108 by a pair of n-wells 18, 20 and the deep n-well 16. In the embodiment shown in FIG. 4, the substrate 108 is a p-type substrate, and the wells 114, 116 are also p-type wells. The first transistor 104 includes a first n-type source-drain region 120 that is coupled to the externally accessible terminal 110 and to the well 114 through a p+ region 115 that is more positively doped than the doping of the p-well 114. A second n-type source-drain region 122 is fabricated in the well 114 and is separated from the first source-drain region 120 by a gate electrode 126 isolated from the well 114 by a gate insulating layer 128. The gate electrode 126 is coupled to receive one of the select signals, Sel. 1 or Sel. 2.

The second transistor 106 similarly includes a first n-type source-drain region 130 fabricated in the well 116, a second n-type source-drain region 132 fabricated in the well 116, and a gate electrode 136 positioned between the source-drain regions 130, 132. The gate electrode 136 is isolated from the well 116 by a gate insulating layer 138. The first source-drain region 130 of the second transistor 106 is coupled to the source-drain region 122 of the first transistor 104, and the second source-drain region 132 of the second transistor 106 is coupled to one of the cores 72, 74 and to the well 116 through a p+ region 117 that is more positively doped than the doping of the p-well 116. The gate electrode 136 is also coupled to the gate electrode 126 of the first transistor 104 so that it also receives one of the select signals, Sel. 1 or Sel. 2. However, the gate electrodes 126, 136 of the respective transistors 104, 106 may alternatively be coupled to respective control signals as long as they both have the appropriate logic levels at the proper times.

Figure 2:
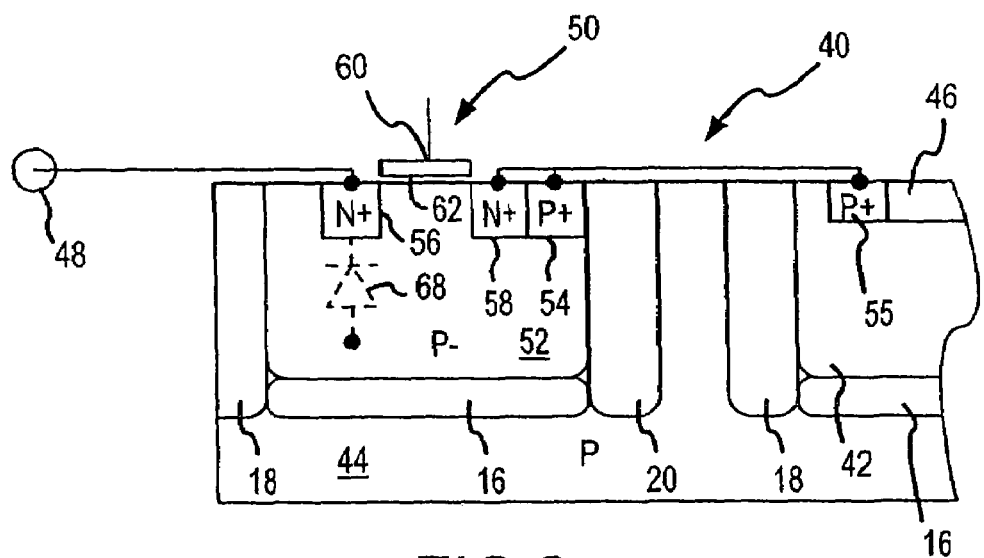
FIG. 2 is another cross-sectional view of a semiconductor structure showing an isolated well fabricated in a substrate and coupled to an externally accessible terminal in a conventional manner.

As with the semiconductor structure of FIG. 2, respective diodes 140, 142 shown in phantom in FIG. 4 are inherently formed by the junction between the source-drain region 122 and the well 114 and by the junction between the source-drain region 130 and the well 116. Respective diodes 140, 142 are also inherently formed by the junction between the source-drain region 120 and the well 114, and by the junction between the source-drain region 132 and the well 116, but these are shunted by the direct connection between the source-drain regions 120, 122 and the wells 114, 116, respectively.

The operation of the semiconductor structure 100 will now be explained with reference to the schematic of an access circuit 144 shown in FIG. 5 that uses the structure 100. The transistors 104, 106 are turned ON to provide the externally accessible terminal 80 with access to one of two output terminals 146, 148 responsive to a high Sel. A or Sel. B signal, respectively. The output nodes 146, 148 are coupled to the DRAM cores 72, 74, respectively. The select signals Sel. A and Sel. B are provided by a control circuit 150, an embodiment of which will be explained with reference to FIG. 6. When one of the Sel signals is low, the respective one of the transistors 104, 106 is turned OFF to isolate the respective core 72, 74 from the externally accessible terminal 80. It is important to note that the semiconductor structure 100 shown in FIG. 4 is fabricated so that the diodes 140, 142 are coupled to each other "back-to-back." As a result, one of the diodes 140, 142 will isolate the core 72 or 74 to which it is coupled from the terminal 80 regardless of the magnitude and polarity of the voltage applied to the terminal 80 as long as the voltage is not large enough to cause the diodes 140, 142 to go into an avalanche breakdown mode. Thus, unlike the semiconductor structure 40 shown in FIG. 2, a test voltage can be applied to one of the cores 72, 74 but not to the other regardless of the magnitude and polarity of the test voltage.

Figure 6:
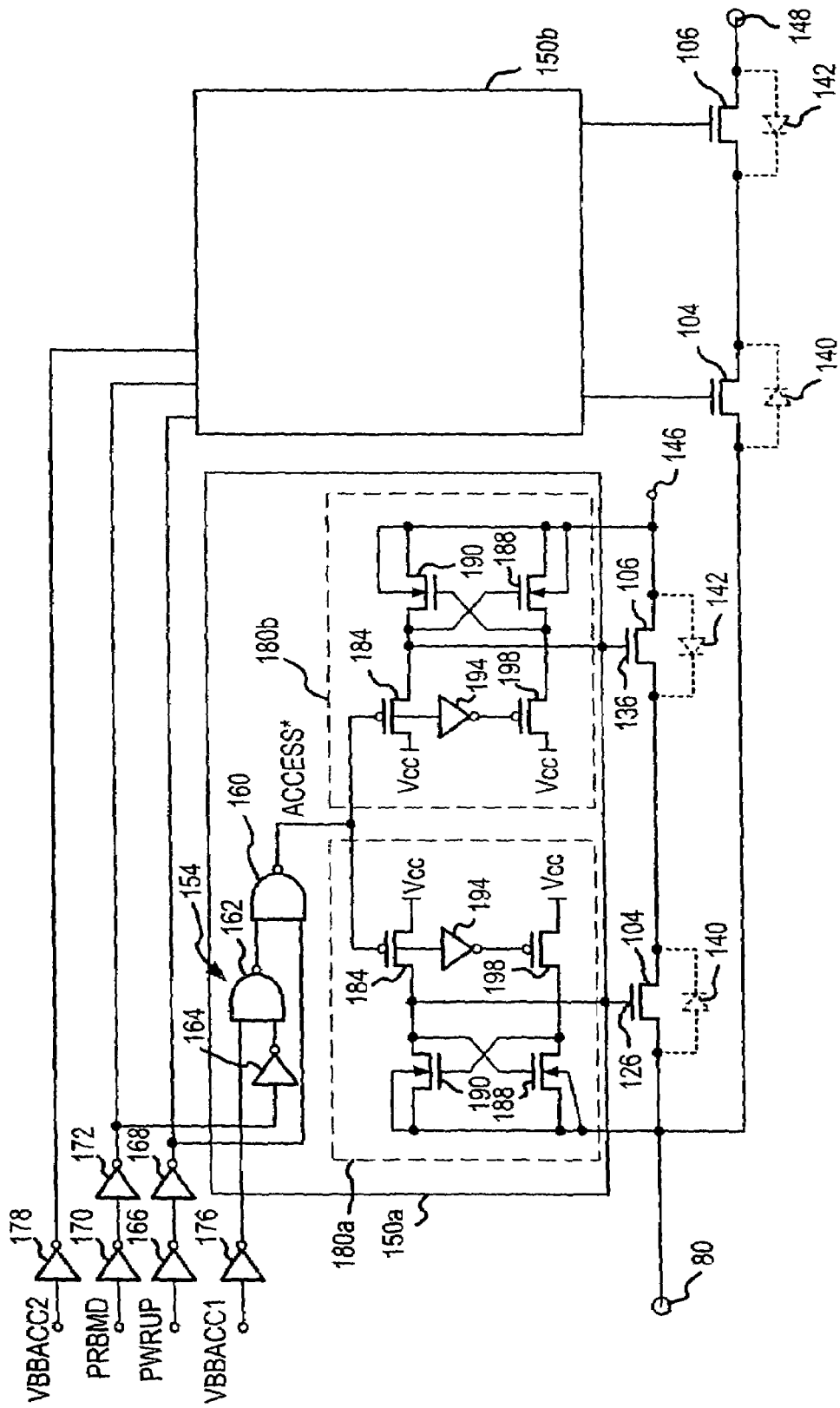
FIG. 6 is a schematic and logic diagram of a control circuit that can be used to generate control signals for use by the semiconductor structure of FIGS. 4 and 5.

One embodiment of the control circuit 150 that can be used to generate the Sel. 1 and Sel. 2 signals is shown in FIG. 6. The control circuit 150a used to generate the Sel. 1 signal is shown in detail in FIG. 6, it being understood that the control circuit 150b used to generate the Sel 2 signal is identical to the circuit 150a. The control circuit 150a includes a decode circuit 154 that includes two NAND gates 160, 162 and one inverter 164. The NAND gate 160 is enabled to generate an active low ACCESS* signal whenever a PWRUP signal is active high, which normally occurs when the cores 72, 74 are operational. The PWRUP signal is generated by coupling a global PWRUP signal through two inverters 166, 168. The NAND gate generates the active low ACCESS* signal whenever either a VBBACC1* signal is active low or PRBMD signal is high and thus causes the inverter 164 to apply a low to the NAND gate 160. The PRBMD signal is generated by coupling a global PRBMD signal through two inverters 170, 172. The VBBACC1* signal, which is generated by coupling a VBBACC1 signal through an inverter 176, is not a global signal and can therefore be used to individually enable the control circuit 150a. A separate access signal, VBBACC2, is coupled through an inverter 178 to supply an active low VBBACC2* signal to the other control circuit 150b.

The ACCESS* signal is applied to two identical drive circuits 180a,b, one of which 180a is coupled to the gate electrode 126 (FIG. 4) to control the conductive state of the first transistor 104 and the other of which 180b is coupled to the gate electrode 136 to control the conductive state of the second transistor 106. Tn the interest of brevity and clarity, an explanation of only the drive circuit 180a will be provided, it being understood that the drive circuit 180b operates in the same manner. When the ACCESS* signal is active low, it turns ON a PMOS transistor 184 thereby coupling a power supply voltage $V_{cc}$ to the gate electrode 126 of the first transistor 104. As previously explained, the first transistor 104 then couples the externally accessible terminal 80 to the second transistor 106. Since both drive circuits 180a,b operate in the same manner, the active low ACCESS* signal also causes the drive circuit 180b to apply $V_{cc}$ to the gate electrode 136 of the second transistor 106, thereby coupling the externally accessible terminal 80 to the output node 146. The control circuit 150b operates in substantially the same manner except that it is enabled by the VBBACC2 signal. As a result, the externally accessible terminal 80 is normally coupled to either the output node 146 or the output node 148, but not both output nodes at the same time.

The voltage $V_{cc}$ coupled through the PMOS transistor 184 is also applied to the gate of an NMOS transistor 188 to turn ON the transistor 188. The transistor 188 is coupled to the gate of an NMOS shunting transistor 190, which is held OFF by the ON transistor 188. The active low ACCESS* signal is also applied to an inverter 194, which then outputs a high to turn OFF a PMOS transistor 198.

When the ACCESS* signal transitions to an inactive high level, it turns OFF the PMOS transistor 184, which subsequently allows the transistor 188 to turn OFF since it no longer couples $V_{cc}$ to the gate of the transistor 188. The high ACCESS* signal also causes the inverter 194 to output a low, which turns on the PMOS transistor 198. The transistor 198 then couples $V_{cc}$ to the gate of the shunting transistor 190, thereby turning the transistor 190 ON. The ON shunting transistor 190 shunts the gate electrode 126 of the first transistor 104 to its source, thereby holding the transistor 104 OFF regardless of what voltage is applied to the externally accessible terminal 80. The ON shunting transistor also holds the transistor 188 in an OFF condition.

As mentioned above, the other control circuit 180b operates in the same manner as the control circuit 180a to hold the second transistor 106 OFF responsive to the inactive high ACCESS* signal.

Figure 5:
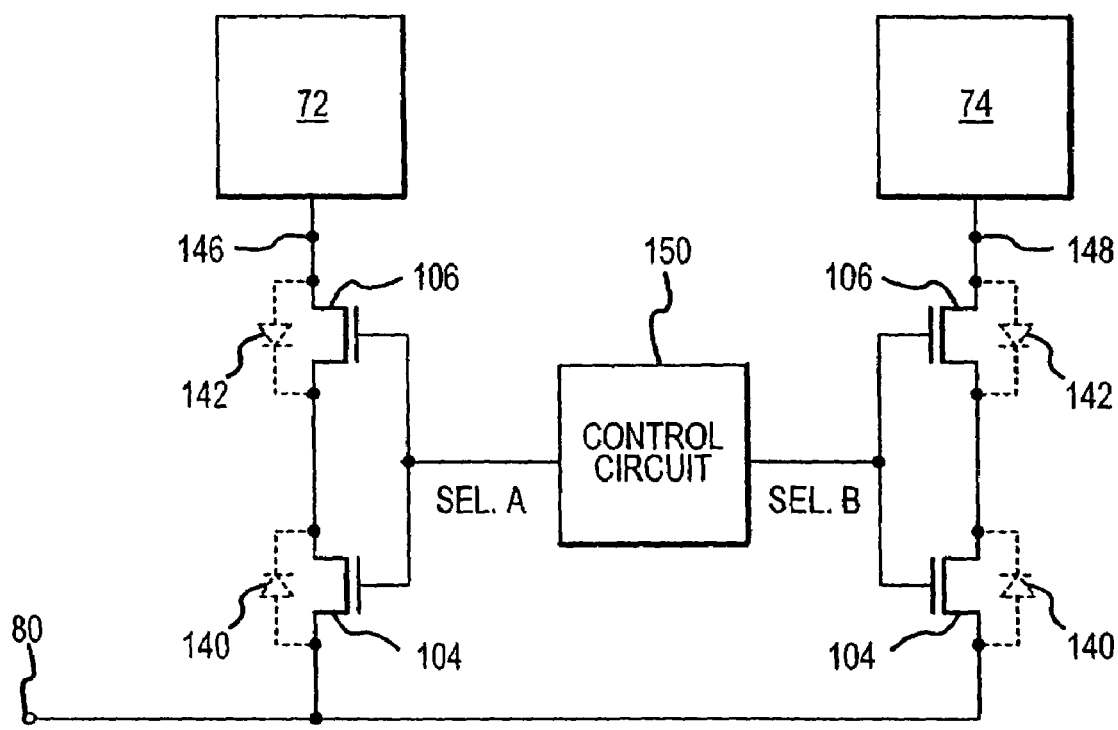
FIG. 5 is a schematic and block diagram of an externally accessible terminal coupled to either of two DRAM cores using the semiconductor structure of FIGS. 3 and 4.
Figure 7:
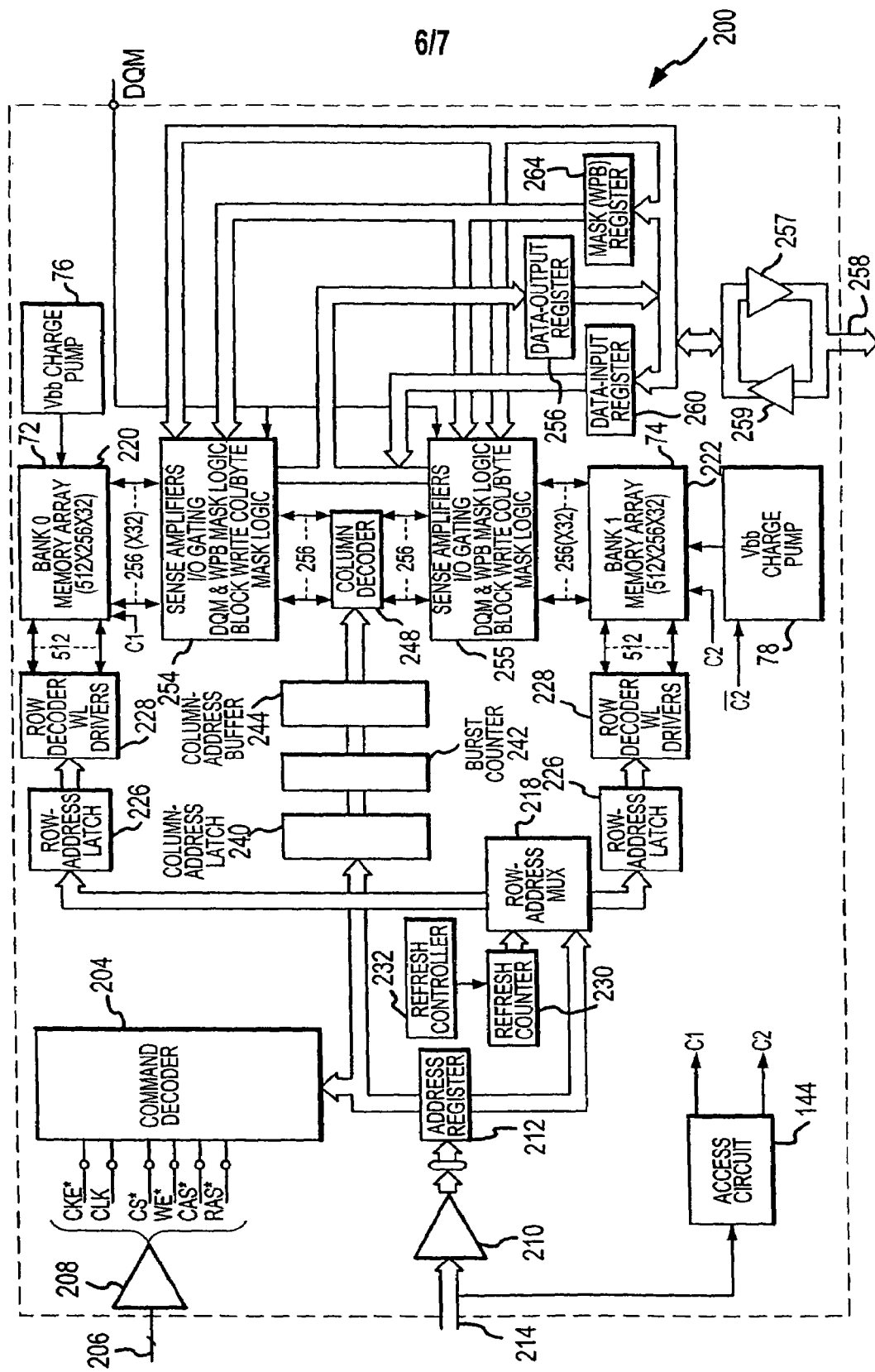
FIG. 7 is a block diagram of one embodiment of a memory device using the semiconductor structure of FIGS. 4 and 5 and the control circuit of FIG. 6, or a semiconductor structure and/or control circuit according to some other embodiment of the invention.

FIG. 7 is a block diagram of a conventional synchronous dynamic random access memory ("SDRAM") 200 that utilizes the access circuit shown in FIGS. 4-6 or some other embodiment of the invention, although various embodiment of the invention can also be used with memory devices other than the SDRAM 200 and devices other than memory devices. The operation of the SDRAM 200 is controlled by a command decoder 204 responsive to high-level command signals received on a control bus 206 and coupled thorough input receivers 208. These high level command signals, which are typically generated by a memory controller (not shown in FIG. 7), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry.out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 7). A row address is generally first received by the address register 212 and applied to a row address multiplexer 218. The row address multiplexer 218 couples the row address to a number of components associated with either of two memory banks 220, 222 depending upon the state of a bank address bit forming part of the row address. As previously explained, each of the memory banks 220, 222 is fabricated in respective DRAM cores 72, 74 that are normally biased to a negative voltage by respective $V_{bb}$ charge pumps 76, 78. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

In accordance with one embodiment of the invention, the lowest-ordered address bit of the address bus 214 is applied to an externally accessible terminal that is coupled through the access circuit 144 to the cores 72, 74 for the respective arrays 220, 222. The SDRAM 200 includes conventional circuitry to generate the global PWRUP and PRBMD signals and the individual VBBACC1 and VBBACC2 signals discussed above with reference to FIG. 6. However, it will be understood that other terminals of the SDRAM 200 may be used as the externally accessible terminal for the access circuit 144, including terminals dedicated to that function. Also, the PWRUP, PRBMD, VBBACC1 and VBBACC2 signals may be generated externally as weal as internally. When the externally accessible terminal is coupled to one or both of the cores 72, 74, it may be desirable to disable the charge pump 78 by generating an active low signal C2* whenever an active low ACCESS* signal is generated in either of the control circuits 150a,b.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 and data output drivers 257 to a data bus 258. Data to be written to one of the arrays 220, 222 are coupled from the data bus 258 through a data input receivers 259 to a data input register 260. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 8:
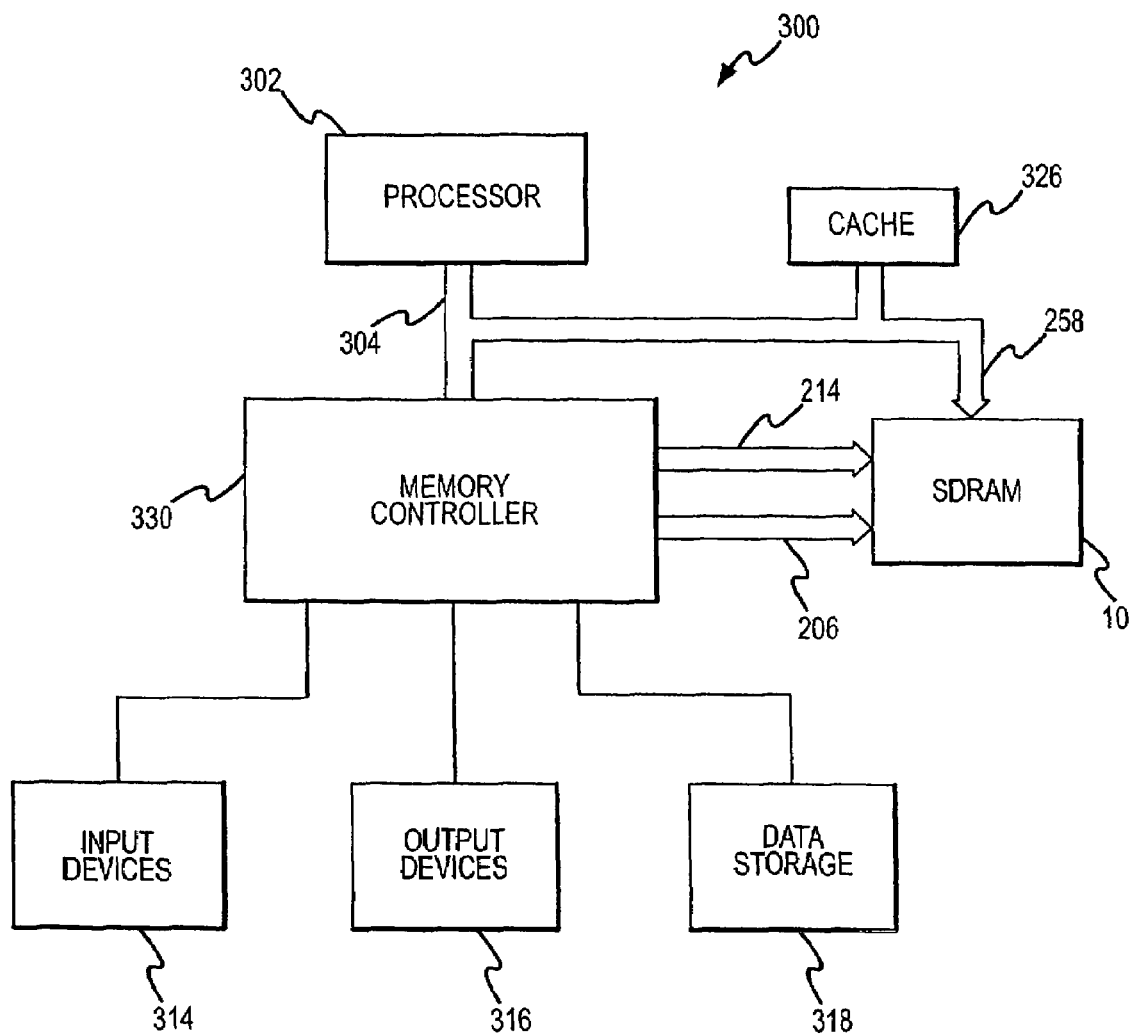
FIG. 8 is a block diagram of one embodiment of a computer system using the memory device of FIG. 7 or some other embodiment of a memory device in accordance with the invention.

FIG. 8 shows an embodiment of a computer system 300 that may use the SDRAM 200 or some other memory device that used one of the embodiments of an access circuit described above or some other embodiment of the invention. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 518 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus coupled to the address bus 214 (FIG. 7) to couple row addresses and column addresses to the SDRAM 200. The memory controller 330 also includes a control bus that couples command signals to the control bus 206 of the SDRAM 200. The external data bus 258 of the SDRAM 200 is coupled to the data bus of the processor 302, either directly or through the memory controller 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method of applying a test voltage to each of a plurality of circuit wells fabricated in a semiconductor substrate of an integrated circuit and isolated from each other, the method comprising:
   applying a test voltage to the integrated circuit through an externally accessible terminal;
   coupling the externally accessible terminal to one of the circuit wells while isolating the externally accessible terminal from the other circuit wells, the act of coupling the externally accessible terminal to one of the circuit wells comprising;

providing first and second transistors fabricated in respective wells of the substrate for each of the circuit wells, the first and second transistors having first source-drain regions interconnecting to each other and second source-drain regions coupled to the wells in which they are fabricated;

coupling the first and second transistors for each of the circuit wells between the externally accessible terminal and the respective circuit well;

applying signals to gate electrodes of the first and second transistors for the one circuit well that causes the first and second transistors to turn on; and applying signals to gate electrodes of the first and second transistors for the other circuit wells that causes the first and second transistors to turn off.

2. The method of claim 1 wherein the semiconductor substrate comprises an n-type substrate, and the wells in which the first and second transistors are fabricated comprise p-type wells.

3. The method of claim 1 wherein the substrate comprises a p-type substrate, and the wells in which the first and second transistors are fabricated and the circuit wells comprise respective n-type wells.

4. The method of claim 1 wherein the integrated circuit comprises a memory integrated circuit.

5. The method of claim 4 wherein the memory circuit comprises a dynamic random access memory circuit.

6. The method of claim 1 wherein the well in which the first transistor is fabricated is different from the well in which the second transistor is fabricated.

7. The method of claim 1 wherein the first transistor is coupled in series with the second transistor.

* * * * *